(12) United States Patent
Lee et al.

(10) Patent No.: US 9,593,417 B2
(45) Date of Patent: Mar. 14, 2017

(54) GAS LINE WELDMENT DESIGN AND PROCESS FOR CVD ALUMINUM

(71) Applicant: Applied Materials, Inc., Santa Clara, CA (US)

(72) Inventors: Wei Ti Lee, San Jose, CA (US); Ted Guo, Palo Alto, CA (US); Steve H. Chiao, San Jose, CA (US); Alan A. Ritchie, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 748 days.

(21) Appl. No.: 14/029,462

(22) Filed: Sep. 17, 2013

(65) Prior Publication Data

US 2014/0053776 A1    Feb. 27, 2014

Related U.S. Application Data

(62) Division of application No. 11/459,575, filed on Jul. 24, 2006, now Pat. No. 8,535,443.

(60) Provisional application No. 60/703,379, filed on Jul. 27, 2005.

(51) Int. Cl.
| | |
|---|---|
| C23C 16/455 | (2006.01) |
| C23C 14/16 | (2006.01) |
| C23C 16/44 | (2006.01) |

(52) U.S. Cl.
CPC ...... *C23C 16/45561* (2013.01); *C23C 14/165* (2013.01); *C23C 16/4402* (2013.01); *C23C 16/4404* (2013.01); *C23C 16/45565* (2013.01); *C23C 16/45591* (2013.01); *Y10T 29/497* (2015.01); *Y10T 29/49826* (2015.01); *Y10T 137/0491* (2015.04); *Y10T 137/9029* (2015.04)

(58) Field of Classification Search
CPC ........ C23C 16/45561; C23C 16/45565; C23C 16/4404; C23C 16/45591; C23C 14/165; C23C 16/4402; Y10T 29/497; Y10T 29/49826; Y10T 137/9029; Y10T 137/0491

See application file for complete search history.

(56) References Cited

U.S. PATENT DOCUMENTS

| | | | |
|---|---|---|---|
| 4,369,101 | A | 1/1983 | Wolff et al. |
| 4,601,802 | A | 7/1986 | Grimes et al. |
| 4,645,581 | A | 2/1987 | Voggenthaler et al. |
| 4,705,611 | A | 11/1987 | Grimes et al. |
| 5,004,883 | A | 4/1991 | Brown et al. |
| 5,313,982 | A | 5/1994 | Ohmi et al. |
| 5,484,484 | A | 1/1996 | Yamaga et al. |
| 5,498,849 | A | 3/1996 | Isshiki et al. |
| 5,866,198 | A | 2/1999 | Sato et al. |
| 5,958,195 | A | 9/1999 | Lorincz et al. |
| 6,660,138 | B2 | 12/2003 | Lin et al. |
| 6,946,062 | B2 | 9/2005 | Lin et al. |
| 8,535,443 | B2 | 9/2013 | Lee et al. |
| 2002/0048635 | A1 | 4/2002 | Kim et al. |
| 2002/0050322 | A1 | 5/2002 | Kunisawa et al. |

(Continued)

*Primary Examiner* — John C Hong
(74) *Attorney, Agent, or Firm* — Patterson & Sheridan, LLP

(57) ABSTRACT

A system of gas lines for a processing chamber and a method of forming a gas line system for a processing chamber are provided. The system of gas lines includes electropolished multi-way valves that connect electropolished linear gas lines. By using multi-way valves rather than tee-fittings and electropolishing the linear gas lines, the nucleation of contaminating particles in the system of gas lines may be reduced.

5 Claims, 3 Drawing Sheets

(56) References Cited

U.S. PATENT DOCUMENTS

2004/0187782 A1    9/2004   McLeod et al.
2005/0022867 A1    2/2005   Maichel et al.

GAS LINE WELDMENT DESIGN AND PROCESS FOR CVD ALUMINUM

CROSS-REFERENCE TO RELATED APPLICATIONS

This application is a divisional of U.S. patent application Ser. No. 11/459,575, filed Jul. 24, 2006, now U.S. Pat. No. 8,535,443, which claims benefit of U.S. Provisional Patent Application Ser. No. 60/703,379, filed Jul. 27, 2005. The aforementioned applications are herein incorporated by reference.

BACKGROUND OF THE INVENTION

Field of the Invention

Embodiments of the present invention generally relate to the design of gas line systems for chemical vapor deposition chambers.

Description of the Related Art

Sub-quarter micron multilevel metallization is one of the key technologies for the next generation of very large scale integration (VLSI). The multilevel interconnects that lie at the heart of this technology require planarization of high aspect ratio apertures, including contacts, vias, lines or other features having aperture widths less than 0.25 μm and aperture depths greater than the aperture widths. Reliable formation of these interconnects is very important to the success of VLSI and to the continued effort to increase circuit density and quality on individual substrates and die.

Metal interconnects are typically formed by physical vapor deposition (PVD), chemical vapor deposition (CVD), electrochemical deposition and/or sequential combinations thereof. CVD metal films, such as CVD aluminum films, provide excellent conformal coverage of features. CVD of aluminum films is typically performed with a bubbled precursor which is transported by means of a carrier gas into the reactor via a gas line system. The bubbled precursor is typically directed though a gas distribution assembly including a showerhead and a blocker plate situated near the top of the chamber. The precursor reacts to form a layer of material on the surface of a substrate that is positioned on a substrate support in the chamber.

The bubbled precursor is introduced into the gas distribution assembly from a system of gas lines that connects sources of the precursor gas and carrier gas to the gas distribution assembly. FIG. 1 illustrates a prior art gas line design 500 having flange connectors for connecting gas sources to a CVD chamber. Flange connectors 502 and 521 connect the gas lines to a nitrogen purge gas source 503. Flange connectors 504 and 523 connect the gas lines to a precursor ampoule 505. Flange connectors 506 and 525 connect the gas lines to a CVD chamber 507. Flange connectors 508 and 527 connect the gas lines to a bypass line 509. Flange connectors 510 and 529 connect the gas lines to a pressure gauge 511. The prior art gas line design includes 3 tee-fittings 512 and three shut-off valves 514 that may trap precursors from the gas source such that material is undesirably deposited in the gas line. The prior art gas line design further comprises flange connectors 520, 522, 524, 526, 528, and 530.

The prior art gas line design also includes twenty weldments 516. The weldments typically provide rough surfaces inside the gas lines. Accumulation of aluminum particles on the weldments from aluminum-containing precursors flowed through the gas lines has been observed. The generation of the contaminating particles may be accelerated depending on the choice of the CVD precursor gas. Over time, the accumulation of the particles on the weldment surfaces inside the gas lines can affect the flow of precursors through the gas lines. Also, particles may flake off and be carried downstream to the chamber and cause damage to other chamber components.

Therefore, there remains a need for a method of reducing the formation of contaminating deposits or particles in gas line systems for chemical vapor deposition chambers.

SUMMARY OF THE INVENTION

The present invention generally provides a system of gas lines for a processing chamber that minimizes the nucleation of contaminating particles in the system. In one embodiment, a system of gas lines for a processing chamber comprises one or more electropolished valves that are three-way valves or higher and comprise outputs, wherein each output of each valve is welded to a flange connector. The system further comprises one or more electropolished linear gas lines, wherein each of the electropolished linear gas lines comprises a first end, a second end, a first flange connector welded to the first end, and a second flange connector welded to the second end, and wherein either the first or second flange connector of each of the one or more electropolished linear gas lines is connected to one of the flange connectors welded to the one or more electropolished valves.

In another embodiment, a system of gas lines for a processing chamber comprises two or more electropolished linear gas lines comprising a first gas line and a second gas line, wherein the first gas line and the second gas line are connected at an angle by an electropolished valve. The electropolished valve is a three-way valve or higher and comprises first and second outputs, wherein the first gas line is connected to the first output of the electropolished valve by a first flange connector on the first output of the electropolished valve, and the second gas line is connected to the second output of the electropolished valve by a second flange connector on the second output of the electropolished valve.

In further embodiments, a method of reducing particle contamination in a chemical vapor deposition chamber by minimizing the formation of particles in the gas line that connects the gas source to the chemical vapor deposition chamber is provided by using three-way valves and segments that are easily electropolished. In one embodiment, a method of forming a gas line system for a processing chamber comprises obtaining one or more electropolished valves that are three-way valves or higher and comprise outputs, wherein each output of each valve is welded to a flange connector. The method further comprises obtaining one or more electropolished linear gas lines, wherein each of the electropolished linear gas lines comprises a first end, a second end, a first flange connector welded to the first end, and a second flange connector welded to the second end and then joining at least one of the electropolished valves to at least one of the electropolished linear gas lines by coupling one of the flange connectors on the at least one electropolished valve to the first flange connector on the at least one electropolished linear gas line.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
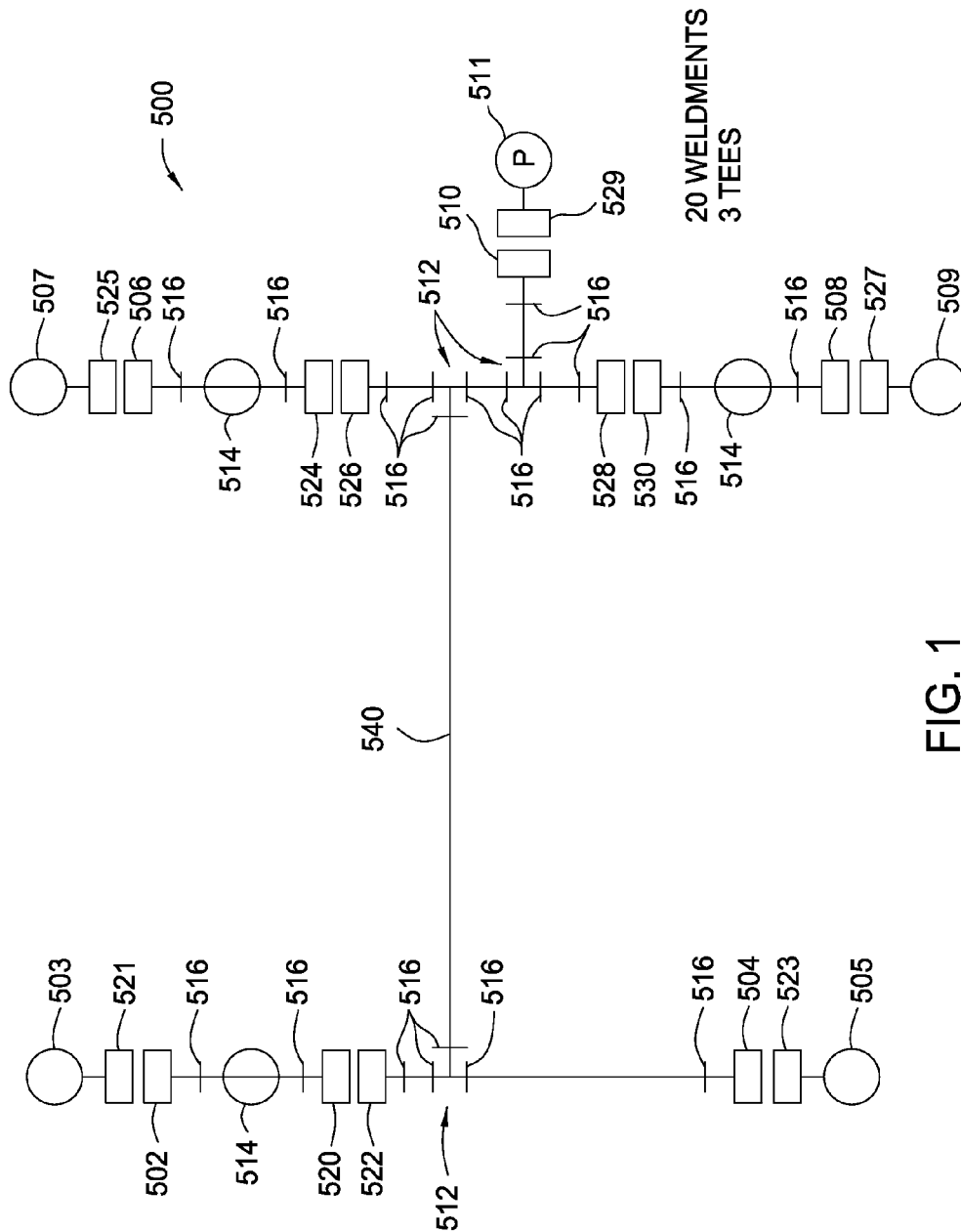
FIG. 1 (Prior Art) is a schematic drawing of a gas line design according to the prior art.

Embodiments of the present invention provide a gas line design for a processing chamber and a method of reducing particle contamination in a processing chamber by minimizing the formation of deposits in gas lines that connect gas sources to the processing chamber. The processing chamber may be a chemical vapor deposition chamber, such as an aluminum CVD chamber. An example of an aluminum CVD chamber is an A×Z chamber, available from Applied Materials, Inc. of Santa Clara, Calif., which may be used to deposit aluminum from the precursor 1-methylpyrrolidine alane (MPA), for example.

In one embodiment, a system of gas lines for a processing chamber is provided. The system comprises one or more electropolished multi-way valves and one or more electropolished linear gas lines. For example, the system may comprise two or more electropolished linear gas lines comprising a first electropolished gas line connected to a second electropolished gas line at an angle by an electropolished multi-way valve. As defined herein, connected "at an angle" refers to a connection that joins two elements that are not linear with respect to each other, i.e., at an angle other than 180° with respect to each other.

The one or more electropolished multi-way valves may be three-way valves or higher, such as four-way valves. Each output of the multi-way valves is welded to a different flange connector. The multi-way valves are electropolished after the flange connectors are welded to the outputs. Electropolishing smoothes the inner surfaces of the multi-way valves, including inner surfaces at the weldments. The electropolished three-way valves described herein may be obtained from Parker Hannifin Corporation, Veriflo Division, of Richmond, Calif.

The one or more electropolished linear gas lines are made by cutting a linear piece of tubing to a desired length and welding a first flange connector to a first end of the tubing and welding a second flange connector to a second end of the tubing. An example of a tubing material that may be used is Valex spec 401. Examples of flange connectors that may be used on the multi-way valves and the linear tubings are HTC VV316L BS3-E flange connectors. The flange connectors may be glands.

After the flange connectors are welded to the ends of the tubings that are prepared to form the desired gas lines, the inner surfaces of the lines are electropolished and passivated to form smoother inner surfaces, e.g., weldment zone areas and the adjacent heated affected zone areas, that are more resistant to particle formation thereon. For example, the surface roughness in the weldment zone areas may be reduced by a factor of two. Prior to electropolishing, the weldment zone areas are typically the roughest areas, and the roughness decreases over the adjacent heat affected zone area. In one aspect, the electropolishing and passivation provides a chrome oxide coating on the inner surfaces of the gas lines. The electropolishing and passivation may also remove free iron from the inner surfaces of the lines and create a chromium rich surface having a Cr/Fe ratio of greater than about 1.5. Removal of free iron is desirable as iron may provide nucleation sites for contaminating particles. The chrome oxide coating may be followed by a nitric acid treatment. The electropolishing and passivation also remove waste by-products that are deposited on the inner surfaces during the welding of the lines. The linear gas lines may be easily electropolished after the flange connectors are welded to the ends of the gas lines, as the gas lines are linear. The gas lines may be electropolished for a period of time, such as between about 3 minutes and about 4 minutes, using standard electropolishing techniques. The gas lines may be polished to have a Ra max of 5, for example. An example of a company that provides electropolishing services for linear gas lines is Integrated Manufacturing Technologies of Fremont, Calif.

Thus, as described above, one embodiment of the invention provides a method of forming a gas line system for a processing chamber, comprising obtaining one or more electropolished multi-way valves and one or more electropolished linear gas lines and joining at least one of the electropolished valves to at least one of the electropolished linear gas lines by coupling a flange connector on an output of the at least one electropolished valve to a flange connector on an end of the at least one electropolished linear gas line. For example, two electropolished linear gas lines may be joined by one electropolished valve at angle, such as an angle of approximately 90°.

Figure 2:
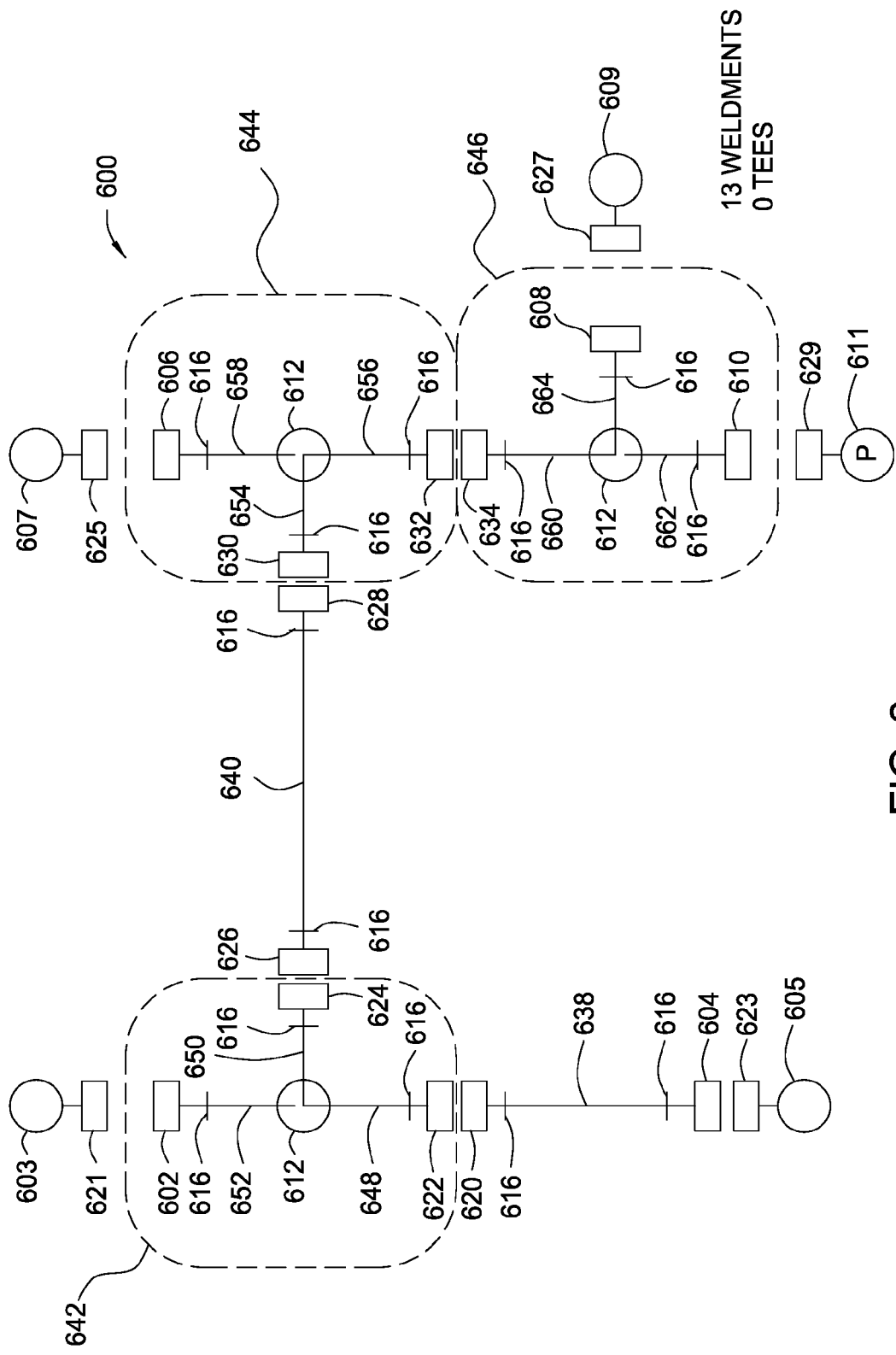
FIG. 2 is a schematic drawing of a gas line design according to an embodiment of the invention.

FIG. 2 illustrates a gas line design 600 for connecting a gas source to a CVD chamber according to an embodiment of the invention. The components of gas line design 600 will be briefly listed first, and then the connection between the components will be described in more detail below. Gas line design 600 also includes flange connectors. Flange connectors 602 and 621 connect the gas lines to a nitrogen purge gas source 603. Flange connectors 604 and 623 connect the gas lines to a precursor ampoule 605, which may provide an aluminum source, for example. Flange connectors 606 and 625 connect the gas lines to a CVD chamber 607. Flange connectors 608 and 627 connect the gas lines to a bypass line 609. Flange connectors 610 and 629 connect the gas lines to a pressure gauge 611. Three-way valves 612 are used to connect the gas lines instead of tee-fittings, which reduces the amount of "dead space" that may trap precursors, and the three-way valves provide more effective purging of any precursors that are trapped in the lines. In another embodiment, four-way valves may be used. The gas line design 600 includes weldments 616, but the number of weldments is reduced to 13 from the twenty weldments 516 in the gas line design 500 of FIG. 1. The gas line design 600 further includes flange connectors 620, 622, 624, 626, 628, 630, 632, and 634. The flange connectors 620, 622, 624, 626, 628, 630, 632, and 634 provide detachable or reversible connections. The flange connectors may be bolted together and then unbolted to separate the gas lines therebetween. Thus, for example, gas line 640 between flange connectors 626 and 628 may be removed easily and electropolished. A similar gas line 540 in the prior art gas line design 500 cannot be easily removed and electropolished as it is located between weldments 516.

The connections between the components of the gas line design 600 will now be described in more detail. The gas line design 600 provides a system of gas lines comprising a first linear gas line 638, a second linear gas line 640, a first three-way valve 642, a second three-way valve 644, and a third three-way valve 646. The first linear gas line 638 comprises flange connector 604 welded to one end and a flange connector 620 welded to the other end. The second linear gas line 640 comprises flange connector 626 welded to one end and a flange connector 628 welded to the other end.

The first three-way valve 642 comprises a first output 648, a second output 650, and a third output 652. Flange connector 622 is welded to the first output 648. Flange connector 602 is welded to the second output 650. Flange connector 624 is welded to the third output 652.

The second three-way valve 644 comprises a first output 654, a second output 656, and a third output 658. Flange connector 630 is welded to the first output 654. Flange connector 632 is welded to the second output 656. Flange connector 606 is welded to the third output 658.

The third three-way valve 646 comprises a first output 660, a second output 662, and a third output 664. Flange connector 634 is welded to the first output 660. Flange connector 610 is welded to the second output 662. Flange connector 608 is welded to the third output 664.

Flange connectors 620 and 622 are connected to join the first linear gas line 638 to the first three-way valve 642. Flange connectors 624 and 626 are connected to join the first three-way valve 642 to the second linear gas line 640. Flange connectors 628 and 630 are connected to join the second linear gas line 640 to the second three-way valve 644. Flange connectors 632 and 634 are connected to join the second three-way valve 644 and the third three-way valve 646.

In the embodiment of FIG. 2, only straight gas lines are used. Although electropolishing of non-linear sections is commercially available, the use of straight gas lines facilitates the electropolishing of the inner surface of the lines, which necessitates inserting an electrode in the center of the gas lines. Also, in the embodiment of FIG. 2 and in other embodiments of the invention, multi-way valves are used instead of tee-fittings, which reduces the number of weldments in the system and eliminates the dead zones created by tee-fittings, and thus, potential contamination nucleation sites in the system are minimized.

Figure 3:
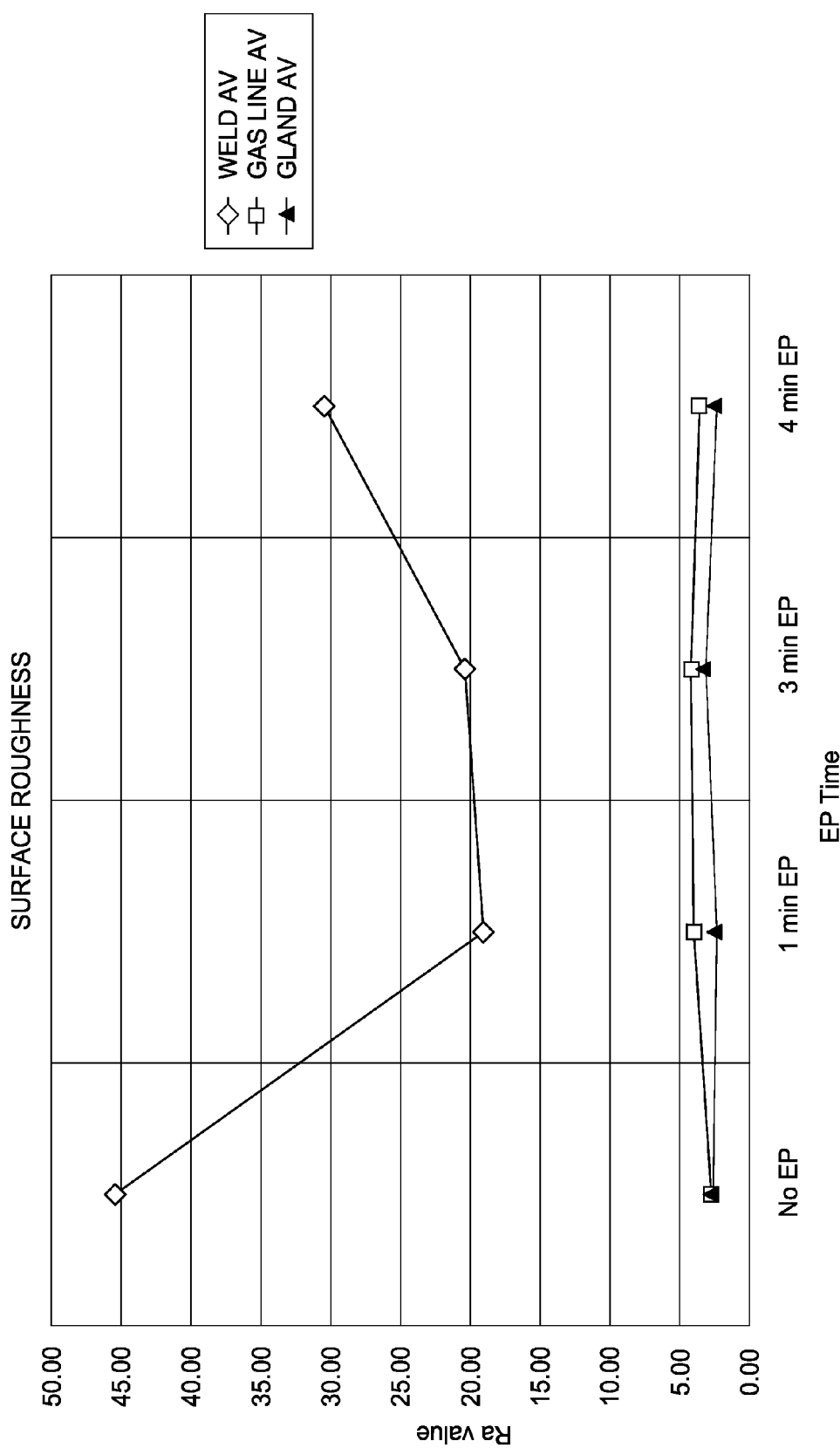
FIG. 3 is a graph showing the roughness of electropolished components of gas line systems according to embodiments of the invention.

Gas lines according to embodiments of the invention, such as the first linear gas line 638 and the second linear gas line 640, were electropolished for 1, 3, or 4 minutes and cross-sectioned to allow inspection of the interior surfaces of the gas lines at different regions, including the weldment zone areas, the flange connector areas, the heat affected zone areas, and the remaining regions of the gas lines. FIG. 3 is a graph that shows the resulting average Ra values obtained at the weldment zone areas, the glands, and the remaining regions of the gas lines after electropolishing was performed. The electropolished regions had improved, smoother surfaces than corresponding non-electropolished regions. The electropolishing-generated improvement in the surface texture of the weldment zone areas was significant and detectable by the naked eye.

While the foregoing is directed to embodiments of the present invention, other and further embodiments of the invention may be devised without departing from the basic scope thereof, and the scope thereof is determined by the claims that follow.

What is claimed is:

1. A method of forming a gas line system for a processing chamber, comprising:
    obtaining one or more electropolished valves that are three-way valves or higher and comprise outputs, wherein each output of each valve is welded to a flange connector, and one or more electropolished linear gas lines, wherein each of the electropolished linear gas lines comprises:
        a first end;
        a second end;
        a first flange connector welded to the first end;
        a second flange connector welded to the second end; and then
    joining at least one of the electropolished valves to at least one of the electropolished linear gas lines by coupling one of the flange connectors on the at least one electropolished valve to the first flange connector on the at least one electropolished linear gas line, wherein the gas line system consists essentially of the one or more electropolished valves, the flange connectors, and the one or more electropolished as lines.

2. The method of claim 1, wherein the one or more electropolished linear gas lines comprises two electropolished linear gas lines, and joining at least one of the electropolished valves to at least one of the electropolished linear gas lines comprises joining one of the electropolished valves to the two electropolished linear gas lines.

3. The method of claim 2, wherein joining one of the electropolished valves to the two electropolished linear gas lines comprises joining the electropolished valve to the two electropolished linear gas lines at an angle.

4. The method of claim 3, wherein the angle is approximately 90°.

5. The method of claim 3, wherein the one or more electropolished linear gas lines are electropolished for between about 3 minutes and about 4 minutes.

* * * * *